US012771343B2

(12) United States Patent
Longstreet et al.

(10) Patent No.: US 12,771,343 B2
(45) Date of Patent: Oct. 20, 2026

(54) FAST SWITCHING RADIO FREQUENCY SWITCH WITH REDUCED SPURS

(71) Applicant: Skyworks Solutions, Inc., Irvine, CA (US)

(72) Inventors: Daniel Louis Longstreet, Greensboro, NC (US); David Steven Ripley, Cedar Rapids, IA (US); Joshua Kawika Ellis, Camarillo, CA (US); Harish Shamanna Muthali, San Jose, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 469 days.

(21) Appl. No.: 18/389,650

(22) Filed: Dec. 19, 2023

(65) Prior Publication Data

US 2024/0204775 A1 Jun. 20, 2024

Related U.S. Application Data

(60) Provisional application No. 63/434,028, filed on Dec. 20, 2022.

(51) Int. Cl.

| | |
|---|---|
| ***H03K 17/687*** | (2006.01) |
| ***H01P 1/10*** | (2006.01) |
| ***H01P 5/18*** | (2006.01) |
| ***H03K 3/011*** | (2006.01) |

(52) U.S. Cl.

CPC ......... *H03K 17/6871* (2013.01); *H03K 3/011* (2013.01)

(58) Field of Classification Search

None

See application file for complete search history.

(56) References Cited

U.S. PATENT DOCUMENTS

| | | | | |
|---|---|---|---|---|
| 6,329,880 | B2 * | 12/2001 | Akiya | H03F 1/56 330/207 P |
| 8,446,256 | B2 * | 5/2013 | Pinkham | G06K 7/10356 340/10.3 |
| 11,431,327 | B2 | 8/2022 | Balteanu et al. | |
| 11,888,504 | B2 * | 1/2024 | Calderin | G01R 21/01 |
| 12,009,567 | B2 * | 6/2024 | Sugawara | H03H 7/48 |
| 12,057,611 | B2 * | 8/2024 | Srirattana | H01P 1/24 |
| 2016/0065167 | A1 * | 3/2016 | Granger-Jones | H03H 7/465 333/112 |
| 2016/0099733 | A1 * | 4/2016 | Weissman | H03F 1/3223 455/114.2 |
| 2016/0127008 | A1 | 5/2016 | Obkircher et al. | |
| 2017/0195146 | A1 * | 7/2017 | Greene | H04L 25/0272 |
| 2018/0108988 | A1 | 4/2018 | Liu et al. | |

(Continued)

*Primary Examiner* — Pablo N Tran

(74) *Attorney, Agent, or Firm* — VIA LLP

(57) ABSTRACT

A radio frequency (RF) switch and a method for controlling an RF switch is disclosed. An example RF switch comprises a switch field-effect transistor disposed between a first node and a second node, the switch field-effect transistor having a source, a drain, a gate, and a body; and a gate voltage control circuit having a voltage input, and a voltage output, the voltage output being coupled to the gate of the switch field-effect transistor, the gate voltage control circuit being configured to transition the state of the switch field-effect transistor between an ON state and an OFF state by changing the voltage supplied to the gate of the field-effect transistor in multiple steps.

20 Claims, 11 Drawing Sheets

(56) References Cited

U.S. PATENT DOCUMENTS

| | | | | |
|---|---|---|---|---|
| 2020/0112300 | A1 | 4/2020 | Balteanu et al. | |
| 2021/0075420 | A1 * | 3/2021 | Kovac | H03K 17/693 |
| 2024/0186963 | A1 * | 6/2024 | Hsu | H03F 3/245 |

* cited by examiner

FAST SWITCHING RADIO FREQUENCY SWITCH WITH REDUCED SPURS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the present disclosure relate to a radio frequency switch, a method of controlling the switch, and modules comprising the switch. In particular, the present disclosure relates to a radio frequency switch that can provide a fast switching time without introducing an unacceptable level of spurious signals into the radio frequency signal.

Description of the Related Technology

Demands are increasing in semiconductor and electronics devices to support radio frequency applications with high linearity in the transmission of radio frequency signals. Switches used in the amplification and/or transmission of radio frequency signals may experience nonlinearity, leading to harmonic distortion and other spurious signal content in an output signal of a communication system. A need exists to reduce or eliminate such nonlinearity and subsequent harmonic distortion, while keeping the size and cost of such switches low and without compromising the switch's speed of switching.

SUMMARY

In some aspects, the techniques described herein relate to a radio frequency coupler including: a plurality of switches, each switch of the plurality of switches including at least one field-effect transistor and a gate voltage control circuit having a voltage input and a voltage output, the voltage output being coupled to a gate of the switch, the gate voltage control circuit being configured to transition a state of the switch between an ON state and an OFF state by changing a voltage supplied to a gate of the at least one field-effect transistor in multiple steps, a direction of power measurement of the radio frequency coupler determined by switching states of the plurality of switches.

In some aspects, the techniques described herein relate to a radio frequency coupler wherein the gate voltage control circuit is configured to transition the state of the at least one field-effect transistor between an ON state and an OFF state by changing the voltage supplied to the gate of the at least one field-effect transistor in two steps.

In some aspects, the techniques described herein relate to a radio frequency coupler wherein the gate voltage control circuit is configured to supply a first voltage in a first step, and a second voltage in a second step, the first voltage approximating a threshold voltage of the at least one field-effect transistor and the second voltage being configured to hold the at least one field-effect transistor in a fully ON or fully OFF state.

In some aspects, the techniques described herein relate to a radio frequency coupler wherein the gate voltage control circuit further includes a switch controller configured to control an output voltage of the voltage output.

In some aspects, the techniques described herein relate to a radio frequency coupler wherein the gate voltage control circuit further includes a comparator configured to compare the output voltage of the voltage output with a reference voltage, the gate voltage control circuit configured to determine whether to supply the first voltage or the second voltage during switching depending on whether the output voltage of the voltage output is determined to be above or below the reference voltage.

In some aspects, the techniques described herein relate to a radio frequency coupler wherein the gate voltage control circuit further includes a first pair of field-effect transistors and a second pair of field-effect transistors, the first pair of field-effect transistors being coupled to the voltage input to control a rising edge of the output voltage and the second pair of field-effect transistors being coupled to respective shunts to ground to control a falling edge of the output voltage.

In some aspects, the techniques described herein relate to a radio frequency coupler further including a temperature compensation circuit, the temperature compensation circuit including one or more field-effect transistors, the reference voltage being configured to be supplied to the comparator via the one or more field-effect transistors.

In some aspects, the techniques described herein relate to a radio frequency coupler wherein the radio frequency coupler forms part of a coupler combiner switch.

In some aspects, the techniques described herein relate to a radio frequency module including: a packaging substrate configured to receive a plurality of components; and at least one radio frequency switch including at least one field-effect transistor; and a gate voltage control circuit having a voltage input and a voltage output, the voltage output being coupled to a gate of the at least one radio frequency switch, the gate voltage control circuit being configured to transition a state of the at least one radio frequency switch between an ON state and an OFF state by changing a voltage supplied to a gate of the at least one field-effect transistor in multiple steps.

In some aspects, the techniques described herein relate to a radio frequency module wherein the gate voltage control circuit is configured to transition a state of the at least one field-effect transistor between an ON state and an OFF state by changing a voltage supplied to the gate of the at least one field-effect transistor in two steps.

In some aspects, the techniques described herein relate to a radio frequency module wherein the gate voltage control circuit is configured to supply a first voltage in a first step, and a second voltage in a second step, the first voltage approximating a threshold voltage of the at least one field-effect transistor and the second voltage being configured to hold the at least one field-effect transistor in a fully ON or fully OFF state.

In some aspects, the techniques described herein relate to a radio frequency module wherein the gate voltage control circuit further includes a switch controller configured to control an output voltage of the voltage output.

In some aspects, the techniques described herein relate to a radio frequency module wherein the gate voltage control circuit further includes a comparator configured to compare the output voltage of the voltage output with a reference voltage, the gate voltage control circuit configured to determine whether to supply the first voltage or the second voltage during switching depending on whether the output voltage of the voltage output is determined to be above or below the reference voltage.

In some aspects, the techniques described herein relate to a radio frequency module further including a temperature compensation circuit, the temperature compensation circuit including one or more field-effect transistors, the reference voltage being configured to be supplied to the comparator via the one or more field-effect transistors.

In some aspects, the techniques described herein relate to a radio frequency module wherein the at least one radio frequency switch forms part of a radio frequency coupler.

In some aspects, the techniques described herein relate to a radio frequency module wherein the at least one radio frequency switch forms part of an antenna switch module.

In some aspects, the techniques described herein relate to a wireless device including: a transceiver configured to generate a radio frequency signal; a front-end module in communication with the transceiver and configured to amplify the radio frequency signal to generate an amplified radio frequency signal, the front-end module including at least one radio frequency switch including at least one field-effect transistor, and a gate voltage control circuit having a voltage input and a voltage output, the voltage output being coupled to a gate of the at least one radio frequency switch, the gate voltage control circuit being configured to transition as state of the at least one radio frequency switch between an ON state and an OFF state by changing a voltage supplied to a gate of the at least one field-effect transistor in multiple steps; and an antenna in communication with the front-end module, the antenna configured to transmit the amplified radio frequency signal.

In some aspects, the techniques described herein relate to a wireless device wherein the at least one radio frequency switch forms part of an antenna swap switch coupled between the front-end module and the antenna.

In some aspects, the techniques described herein relate to a wireless device wherein the at least one radio frequency switch forms part of a radio frequency coupler.

In some aspects, the techniques described herein relate to a wireless device wherein the at least one radio frequency switch forms part of an antenna switch module.

According to one embodiment there is provided a radio frequency (RF) switch comprising: a switch field-effect transistor disposed between a first node and a second node, the switch field-effect transistor having a source, a drain, a gate, and a body; and a gate voltage control circuit having a voltage input, and a voltage output, the voltage output being coupled to the gate of the switch field-effect transistor, the gate voltage control circuit being configured to transition the state of the switch field-effect transistor between an ON state and an OFF state by changing the voltage supplied to the gate of the field-effect transistor in multiple steps.

In one example, the gate voltage control circuit is configured to transition the state of the switch field-effect transistor between an ON state and an OFF state by changing the voltage supplied to the gate of the field-effect transistor in two steps.

In one example, the gate voltage control circuit is configured to supply a first voltage in a first step, and a second voltage in a second step, the first voltage approximating a threshold voltage of the switch field-effect transistor and the second voltage being configured to hold the switch field-effect transistor in a fully ON or fully OFF state.

In one example, during transitioning of the switch field-effect transistor to the ON state, the first voltage is slightly above a threshold voltage of the switch field-effect transistor and the second voltage is configured to hold the switch field-effect transistor in a fully ON state.

In one example, during transitioning of the switch field-effect transistor to the OFF state, the first voltage is slightly below a threshold voltage of the switch field-effect transistor and the second voltage is configured to hold the switch field-effect transistor in a fully OFF state.

In one example, the gate voltage control circuit further comprises a switch controller configured to control an output voltage of the voltage output.

In one example, the switch controller includes a voltage control input, the voltage control input configured to control the timing of switching the switch field-effect transistor between the ON state and the OFF state.

In one example, the gate voltage control circuit further comprises a comparator configured to compare the output voltage of the voltage output with a reference voltage.

In one example, the gate voltage control circuit is configured to determine whether to supply the first voltage or the second voltage during switching depending on whether the output voltage of the voltage output is determined to be above or below the reference voltage.

In one example, during transitioning of the state of the switch filed-effect transistor to the ON state the gate voltage control circuit is configured: to supply the first voltage if the output voltage of the voltage output is determined by the comparator to be below the reference voltage; and to supply the second voltage if the output voltage of the voltage output is determined by the comparator to be above the reference voltage, the second voltage being configured to hold the switch field-effect transistor in a fully ON state.

In one example, transitioning the state of the switch filed-effect transistor to the OFF state the gate voltage control circuit is configured: to supply the first voltage if the output voltage of the voltage output is determined by the comparator to be above the reference voltage; and to supply the second voltage if the output voltage of the voltage output is determined by the comparator to be below the reference voltage, the second voltage being configured to hold the switch field-effect transistor in a fully OFF state.

In one example, the gate voltage control circuit further comprises two pairs of field-effect transistors, the first pair of field-effect transistors being coupled to the voltage input to control the rising edge of the output voltage and the second pair of field-effect transistors being coupled to respective shunts to ground to control the falling edge of the output voltage.

In one example, the RF switch further comprises a temperature compensation circuit, the temperature compensation circuit including one or more field-effect transistors, the reference voltage being configured to be supplied to the comparator via the one or more field-effect transistors.

According to another embodiment, there is provided an antenna coupler comprising one or more RF switches according to the above embodiment.

According to another embodiment, there is provided an antenna coupler switch combiner comprising one or more RF switches according to the above embodiment.

According to another embodiment, there is provided an RF module comprising: a packaging substrate configured to receive a plurality of components; and an RF switch according to the above embodiment, said switch being implemented on the packaging substrate.

According to another embodiment, there is provided a wireless device comprising: a transceiver configured to generate a radio-frequency (RF) signal; a front-end module (FEM) in communication with the transceiver, the FEM including a packaging substrate configured to receive a plurality of components, the FEM further including an RF switch implemented on the packaging substrate, the RF switch including a switch field-effect transistor disposed between a first node and a second node, the switch field-effect transistor having a source, a drain, a gate, and a body, the RF switch including a gate voltage control circuit having a voltage input, and a voltage output, the voltage output being coupled to the gate of the switch field-effect transistor, the gate voltage control circuit being configured to transition the state of the switch field-effect transistor between an ON state and an OFF state by changing the voltage supplied to the gate of the field-effect transistor in multiple steps; and an antenna in communication with the FEM, the antenna configured to transmit the amplified RF signal.

According to another embodiment, there is provided a method for an RF switch, the method comprising: transitioning, by a gate voltage control circuit, the state of a switch field-effect transistor between an ON state and an OFF state by changing a voltage supplied to a gate of the field-effect transistor by a voltage output of the gate voltage control circuit in multiple steps.

In one example, the state of the switch field-effect transistor is transitioned between the ON state and the OFF state by changing the voltage supplied to the gate of the field-effect transistor in two steps.

In one example, a first voltage is supplied by the gate voltage control circuit in a first step, and a second voltage is supplied by the gate voltage control circuit in a second step, the first voltage approximating a threshold voltage of the switch field-effect transistor and the second voltage being configured to hold the switch field-effect transistor in a fully ON or fully OFF state.

In one example, during transitioning of the switch field-effect transistor to the ON state, the first voltage is slightly above a threshold voltage of the switch field-effect transistor and the second voltage is configured to hold the switch field-effect transistor in a fully ON state.

In one example, during transitioning of the switch field-effect transistor to the OFF state, the first voltage is slightly below a threshold voltage of the switch field-effect transistor and the second voltage is configured to hold the switch field-effect transistor in a fully OFF state.

In one example, the timing of switching the switch field-effect transistor between the ON state and the OFF state is controlled by a voltage control input received at a switch controller that is configured to control an output voltage of the gate voltage control circuit.

In one example, the method further comprises comparing by a comparator the output voltage of the gate voltage control circuit with a reference voltage.

In one example, the method further comprises determining, by the gate voltage control circuit, whether to supply the first voltage or the second voltage during switching depending on whether the output voltage of the gate voltage control circuit is determined to be above or below the reference voltage.

In one example, during transitioning of the state of the switch filed-effect transistor to the ON state: the first voltage is supplied if the output voltage of the voltage output is determined by the comparator to be below the reference voltage; and the second voltage is supplied if the output voltage of the gate voltage control circuit is determined by the comparator to be above the reference voltage, the second voltage being configured to hold the switch field-effect transistor in a fully ON state.

In one example, during transitioning the state of the switch filed-effect transistor to the OFF state: the first voltage is supplied if the output voltage of the voltage output is determined by the comparator to be above the reference voltage; and the second voltage is supplied if the output voltage of the gate voltage control circuit is determined by the comparator to be below the reference voltage, the second voltage being configured to hold the switch field-effect transistor in a fully OFF state.

In one example, the method further comprises supplying the reference voltage to the comparator via a temperature compensation circuit including one or more field-effect transistors.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment", "some embodiments", "an alternate embodiment", "various embodiments", "one embodiment", or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
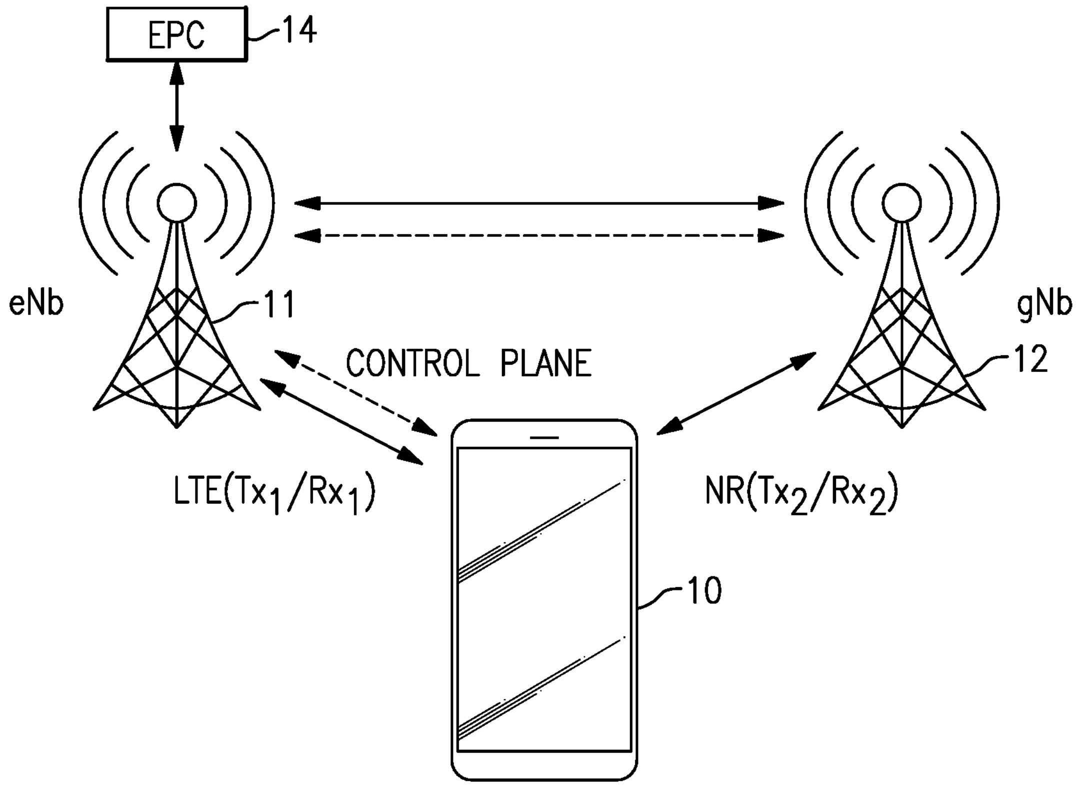
FIG. 1 is a diagram of an example dual connectivity network topology.

Aspects and embodiments described herein are directed to an improved switch, for radio frequency (RF) signals, that provides fast switching times while minimizing the level of harmonic distortion introduced into the RF signal. For example, this can provide an RF switch having a fast switching time for use in coupling circuits.

RF switches, such as transistor switches, can be used to switch signals between one or more poles and one or more throws. Transistor switches, or portions thereof, can be controlled through transistor biasing and/or coupling. Design and use of bias and/or coupling circuits in connection with RF switches can affect switching performance.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and developed this further with 5G Evolution technology in Releases 16 and 17. 3GPP is currently in the process of developing 5G Advanced technology in Release 18 to incorporate Artificial Intelligence (AI) and Machine Learning (ML) techniques. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Dual Connectivity

With the introduction of the 5G NR air interface standards, 3GPP has allowed for the simultaneous operation of 5G and 4G standards in order to facilitate the transition. This mode can be referred to as Non-Stand-Alone (NSA) 5G operation or E-UTRAN New Radio-Dual Connectivity (EN-DC) and involves both 4G and 5G carriers being simultaneously transmitted from a user equipment (UE).

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

FIG. 1 is a diagram of an example dual connectivity network topology. This architecture can leverage LTE legacy coverage to ensure continuity of service delivery and the progressive rollout of 5G cells. A UE 10 can simultaneously transmit dual uplink LTE and NR carrier. The UE 10 can transmit an uplink LTE carrier Tx1 to the eNB 11 while transmitting an uplink NR carrier Tx2 to the gNB 12 to implement dual connectivity. Any suitable combination of uplink carriers Tx1, Tx2 and/or downlink carriers Rx1, Rx2 can be concurrently transmitted via wireless links in the example network topology of FIG. 1. The eNB 11 can provide a connection with a core network, such as an Evolved Packet Core (EPC) 14. The gNB 12 can communicate with the core network via the eNB 11. Control plane data can be wireless communicated between the UE 10 and eNB 11. The eNB 11 can also communicate control plane data with the gNB 12. Control plane data can propagate along the paths of the dashed lines in FIG. 1. The solid lines in FIG. 1 are for data plane paths.

In the example dual connectivity topology of FIG. 1, any suitable combinations of standardized bands and radio access technologies (e.g., FDD, TDD, SUL, SDL) can be wirelessly transmitted and received. This can present technical challenges related to having multiple separate radios and bands functioning in the UE 10. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

As discussed above, EN-DC can involve both 4G and 5G carriers being simultaneously transmitted from a UE. Transmitting both 4G and 5G carriers from a UE, such as a phone, typically involves two power amplifiers (PAS) being active at the same time. Traditionally, having two power amplifiers active simultaneously would involve the placement of one or more additional power amplifiers specifically suited for EN-DC operation. Additional board space and expense is incurred when designing to support such EN-DC/NSA operation.

In LTE implementations, the sub-carrier spacing was typically set to 15 kHz. To address the size constraints and antenna efficiency, antenna tuners have been introduced by phone manufactures to use smaller and more compact antenna designs. In order to achieve an optimum antenna matching, a transceiver feedback receiver may be used to measure the forward (FWD) and reverse (REV) power of the power amplifier (PA) module. This may be achieved by switching between FWD and REV modes. Fast switching leads to higher order harmonic frequencies mixing with the transmit (TX) chain. These higher order harmonic frequencies represent spurious signals that may be seen to overlap the receive (RX) frequency range due to the frequency conversion of the harmonic distortion. The unwanted spurious RF energy causes receiver sensitivity degradation/desense.

Various wireless or communication devices use electromagnetic couplers to sense RF or other signal levels at various locations along a signal path. For example, couplers are often used to provide a signal sample near an antenna to detect transmitted or received signal power or to detect reflected power due to antenna mismatches. Couplers are also used near amplifiers to detect signal power or to analyze the amplified signal to detect distortion or other amplifier artifacts. In some applications, multiple couplers may be interconnected to provide various coupled signals.

The amplitude of the spurious RF content is proportional to the TX level and the rate of switching. Solutions for reducing these spurious RF signals in order to prevent receiver sensitivity degradation involved reducing the switching speed of the RF switches involved in the circuits. In some LTE implementations, this has been achieved by slowing the switching times down to the range of 2.5 μs in order to achieve a balance between the switching speed and the level of the spurious RF signals produced.

Figure 2:
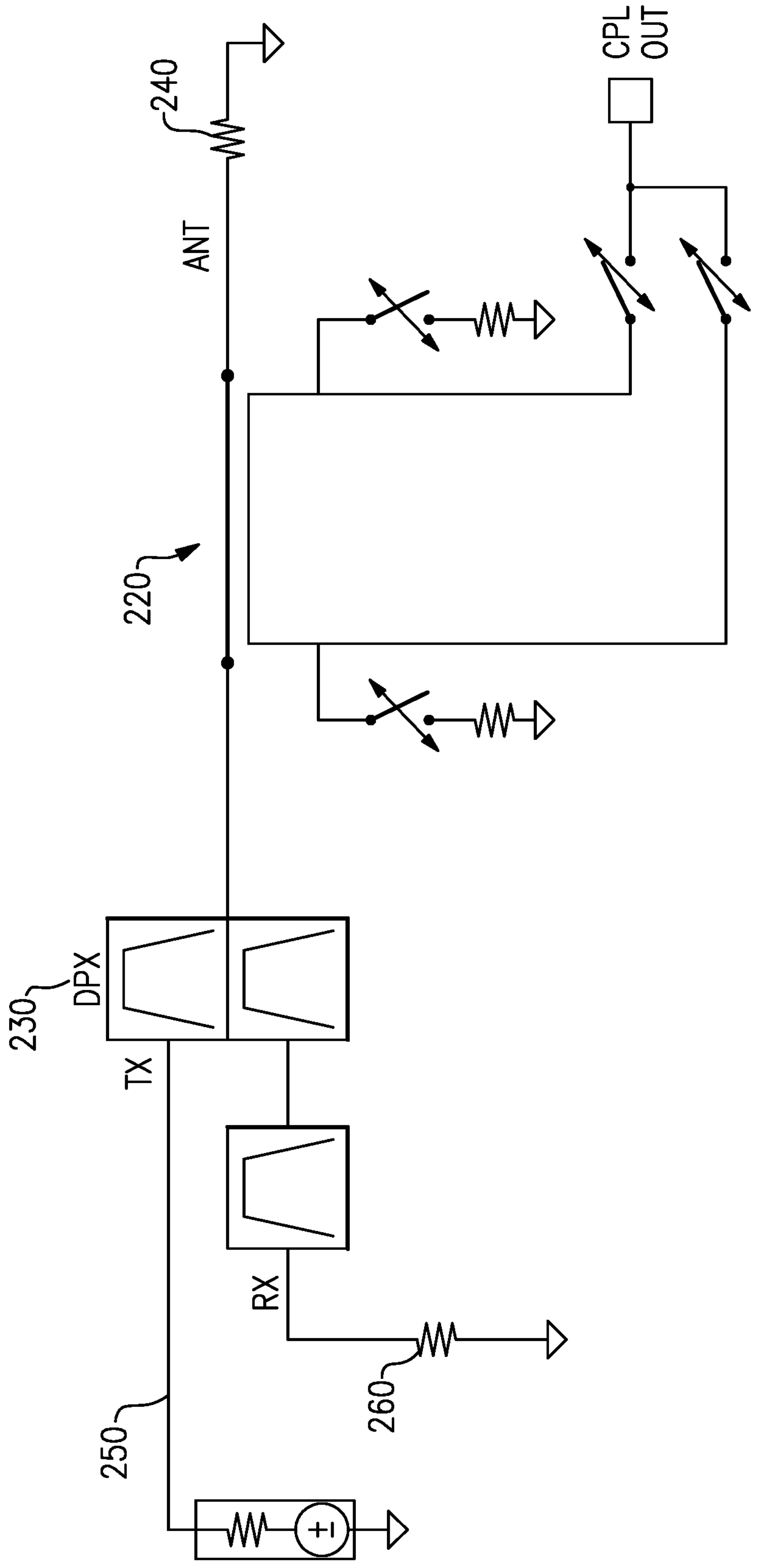
FIG. 2 illustrates a simplified schematic of a coupler.

FIG. 2 illustrates a simplified schematic of a coupler 220 that is configured to hot switch in order to measure the forward (FWD) and redverse (REV) power output. The coupler 220 is positioned between the duplexer 230 and the antenna output 240. For a given TX power input on the transmit chain 250 the transient power and voltage waveform may be monitored at the RX port 260.

In some implementations, transistor-based switches may be used to provide switching functionality, for example one or more field effect transistors (FETs). Each FET may have a gate, a source, a drain, and a body contact. A single switch may be implemented using a single FET, or alternatively a plurality of FETs may be connected (or stacked) together in series to form a single switch having the desired voltage or power output characteristics. The illustrated coupler 220 includes first, second, third, and fourth switches 221-224. According to some embodiments, a controller of a front end module or other appropriate component can control the second and third switches 222, 223 to be closed and the first and fourth switches 221, 224 to be open to measure FWD power output on the coupler output CPL OUT. In this state, FWD power coming from the transmit chain 250 in the direction of the antenna 240 couples from the first transmission line 225 of the coupler 220 to the second transmission line 226 of the coupler 220, and couples to the coupler output CPL OUT through the switch 223. Conversely, the controller can control the first and fourth switches 221, 224 to be closed and second and third switches 222, 223 to be open to measure REV power on the coupler output CPL OUT. In this state, REV power coming from the antenna 240 in the direction of the duplexer 230 couples from the first transmission line 225 of the coupler 220 to the second transmission line 226 of the coupler 220 and couples to the coupler output CPL OUT through the switch 224. While not shown in FIG. 2, the coupler 220 can in other embodiments be a coupler switch combiner in which one or more additional RF inputs can be switched in to be coupled to combine at the coupler output CPL OUT.

In some implementations, the switching speed of a FET switch was reduced in order to reduce the spurious RF signals produced. One means for reducing this switching speed is to add a resistor in front of the gate of the FET switch. Together with the parasitic capacitance of the gate of the FET switch, this creates an RC filter that slows down the rate of change of the gate voltage (slew rate) under an applied gate voltage from the voltage drive source. This may be referred to as RC spooling, and by reducing the slew rate in this manner, the generation of electromagnetic interference/intermodulation distortion can be seen to be reduced.

Figure 3:
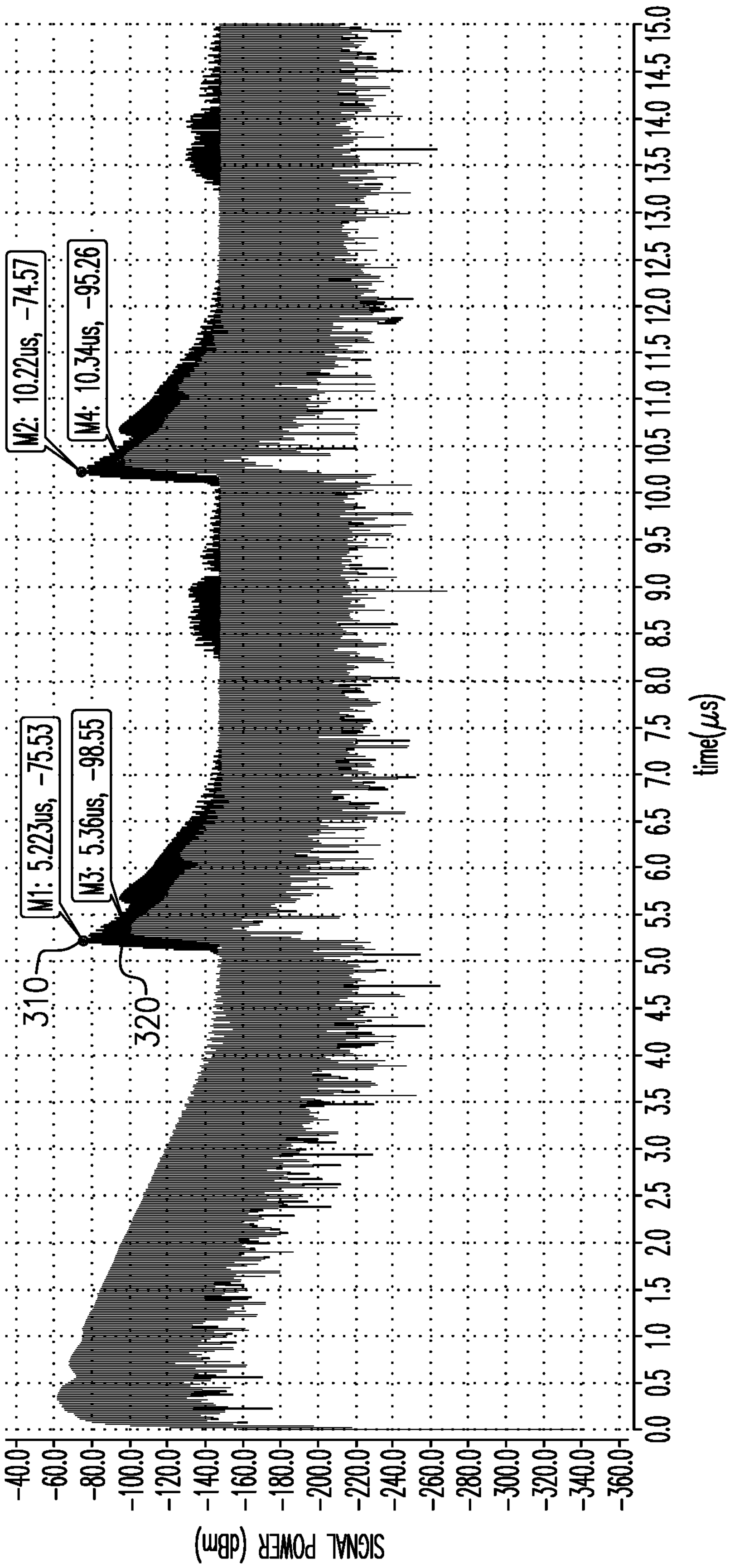
FIG. 3 is a simulation of the spurious signal that is received at the RX port during switching for different switching speeds.
Figure 4:
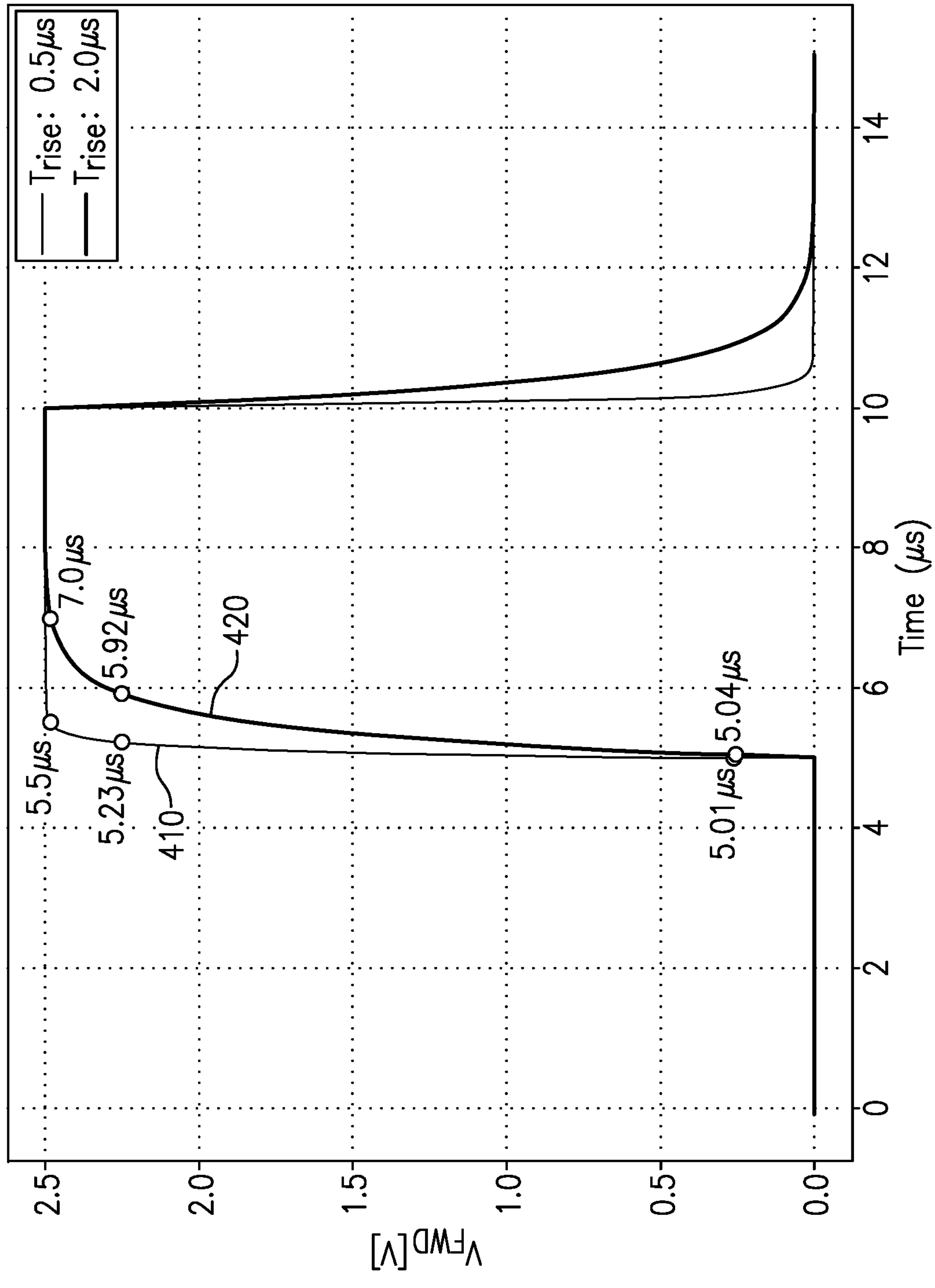
FIG. 4 is a graph of the gate voltage for a FWD series switch over time for different switching speeds.

FIG. 3 illustrates a simulation of the spurious signal that is received at the RX port with trace 310 representing the signal power for a switching speed of 0.5 μs and trace 320 representing the signal power for a switching speed of 2.0 μs. As can be seen from the simulation, an approximately 20 dB reduction in the spurious signal during switching can be achieved by reducing the switching speed from 0.5 μs to 2.0 μs. FIG. 4 illustrates the gate voltage of a FWD series switch over time, with trace 410 representing a switching speed of 0.5 μs and trace 420 representing a switching speed of 2.0 μs.

While such a reduction in the switching time was acceptable for 4G LTE, these speeds would not be sufficient to satisfy 5G NR requirements. 5G NR introduced multiple sub-carrier spacings 15, 30, 60, 120, and 240 kHz, which was a significant change over LTE single sub-carrier spacing of 15 kHz. Another advancement was the number of antennas required for 5G NR to support ENDC. Accordingly, for 5G NR the switching requirements have been reduced to 1.0 μs at nominal conditions, and 1.5 μs over extreme conditions. Prior solutions have not been able to meet this reduction in the switching time without causing an unacceptable level of receiver sensitivity degradation in 5G NR applications.

The inventors of the present application have appreciated that the level of spurious emissions at fast switching times can be reduced by reducing the rate of change of the gate voltage at the FET switch in the region of the threshold voltage for the FET switch. In one example, the gate voltage slew rate is slowed through the threshold voltage of the FET switch by increasing the gate voltage in multiple steps while transitioning the switch to an ON state, and reducing the gate voltage in multiple steps while transitioning the switch to an OFF state.

Figure 5:
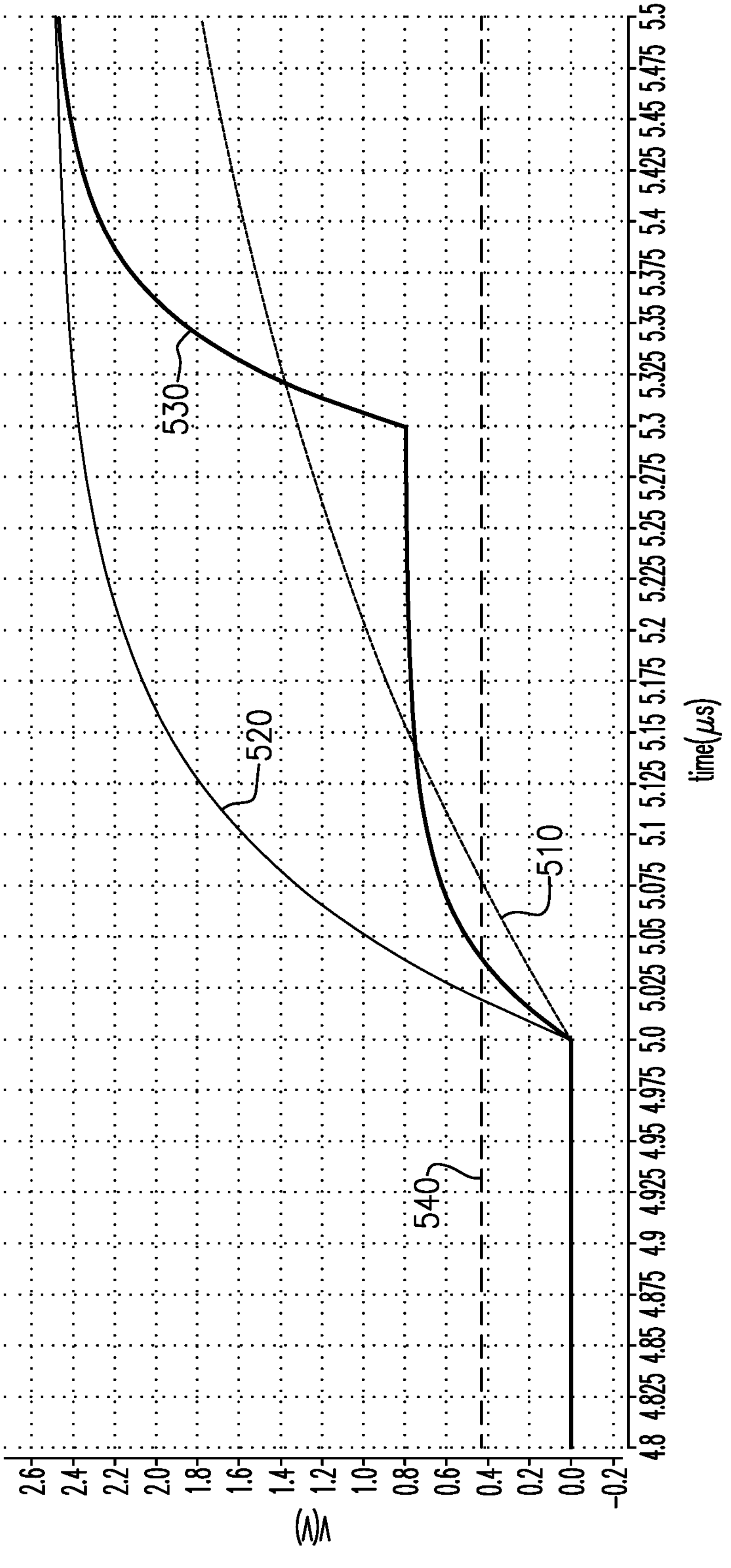
FIG. 5 is a graph of the rising edge of the gate voltage for a FWD series switch over time for different switching speeds.

FIG. 5 illustrates the change of the rising edge of the gate voltage over time while switching a FET switch in three different manners. Line 510 indicates the gate voltage change for a 2.0 μs switching speed, line 520 indicates the gate voltage change for a 0.5 μs switching speed, and line 530 indicates the gate voltage change for a 0.5 μs switching speed implemented in two steps. Line 540 illustrates a threshold voltage for the FET switch. As can be seen from FIG. 5, the rate of change of the voltage for the 0.5 μs line 520 as the gate voltage crosses the threshold voltage 540 is much greater than the rate of change of the voltage for the 2.0 μs line 510 as the gate voltage crosses the threshold voltage 540. However, by stepping up the gate voltage in two steps and setting the target voltage for the first step to be a similar voltage level to the threshold voltage of the FET switch, the reduction in slew rate as the gate voltage approaches the target voltage of the first step can be used to provide a slower voltage rate of change around the threshold voltage of the FET switch. In one example, the target voltage for the first step up can be set to be slightly higher than the threshold voltage of the FET switch as illustrated in line 530 of FIG. 5. The target voltage for the second step can then be set to the fully ON voltage in a similar manner to line 520. In this manner, is can be seen that the 0.5 μs line 530 reaches the fully ON voltage in the same amount of time as the 0.5 μs line 520, but the voltage stepping of the 0.5 μs line 530 results in a reduced slew rate in the region of the voltage threshold of the FET switch.

Figure 6:
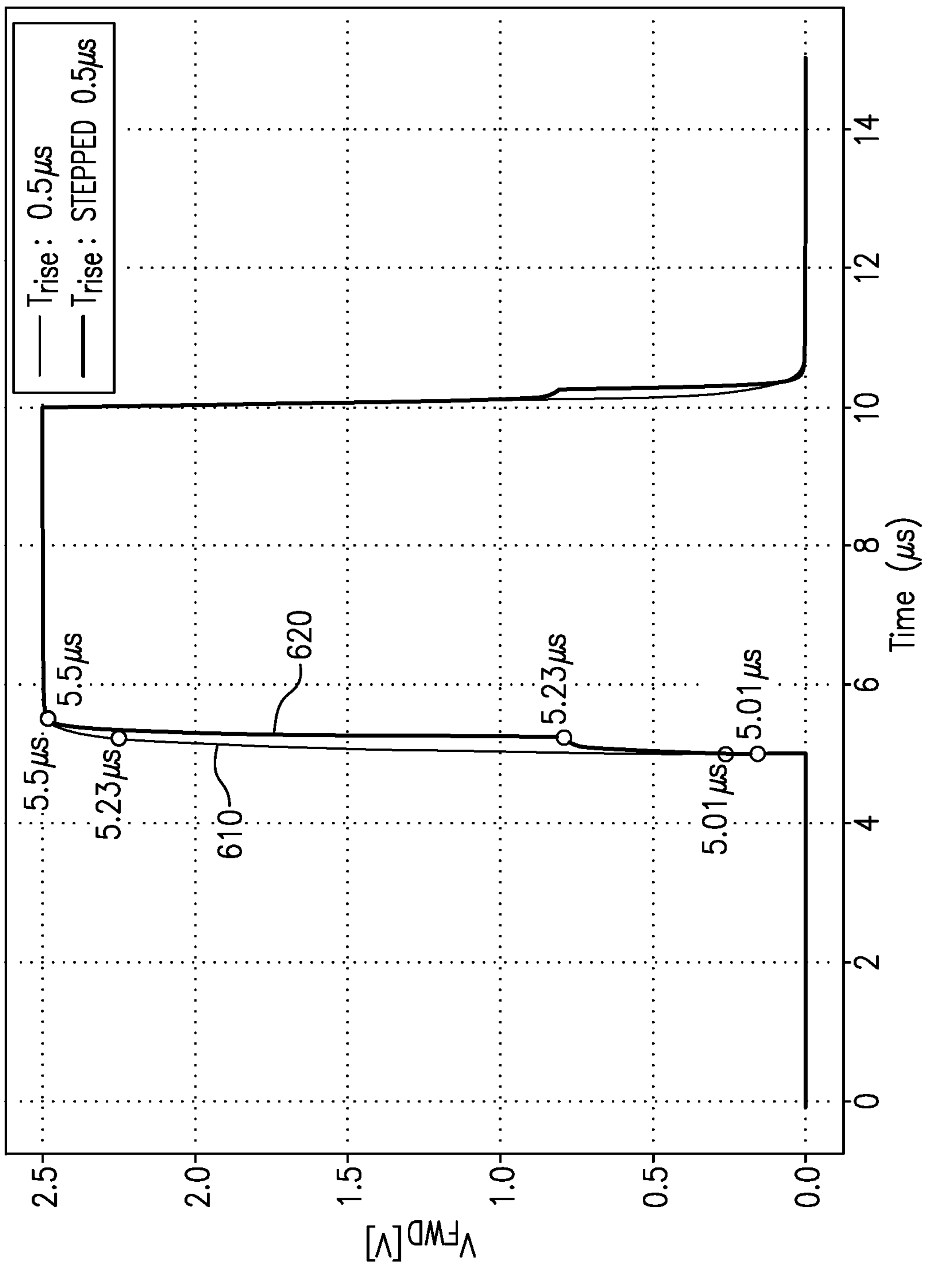
FIG. 6 is a further graph of the gate voltage for a FWD series switch over time for different switching speeds.

FIG. 6 is a further graph of the gate voltage for a FWD series switch over time for different switching speeds, showing both the rising and falling edges. Trace 610 representing a switching speed of 0.5 μs in one voltage step and trace 620 representing a switching speed of 0.5 μs in two voltage steps. As can be seen from FIG. 6, the overall switching speed between lines 610 and 620 provide comparable performance.

Figure 7:
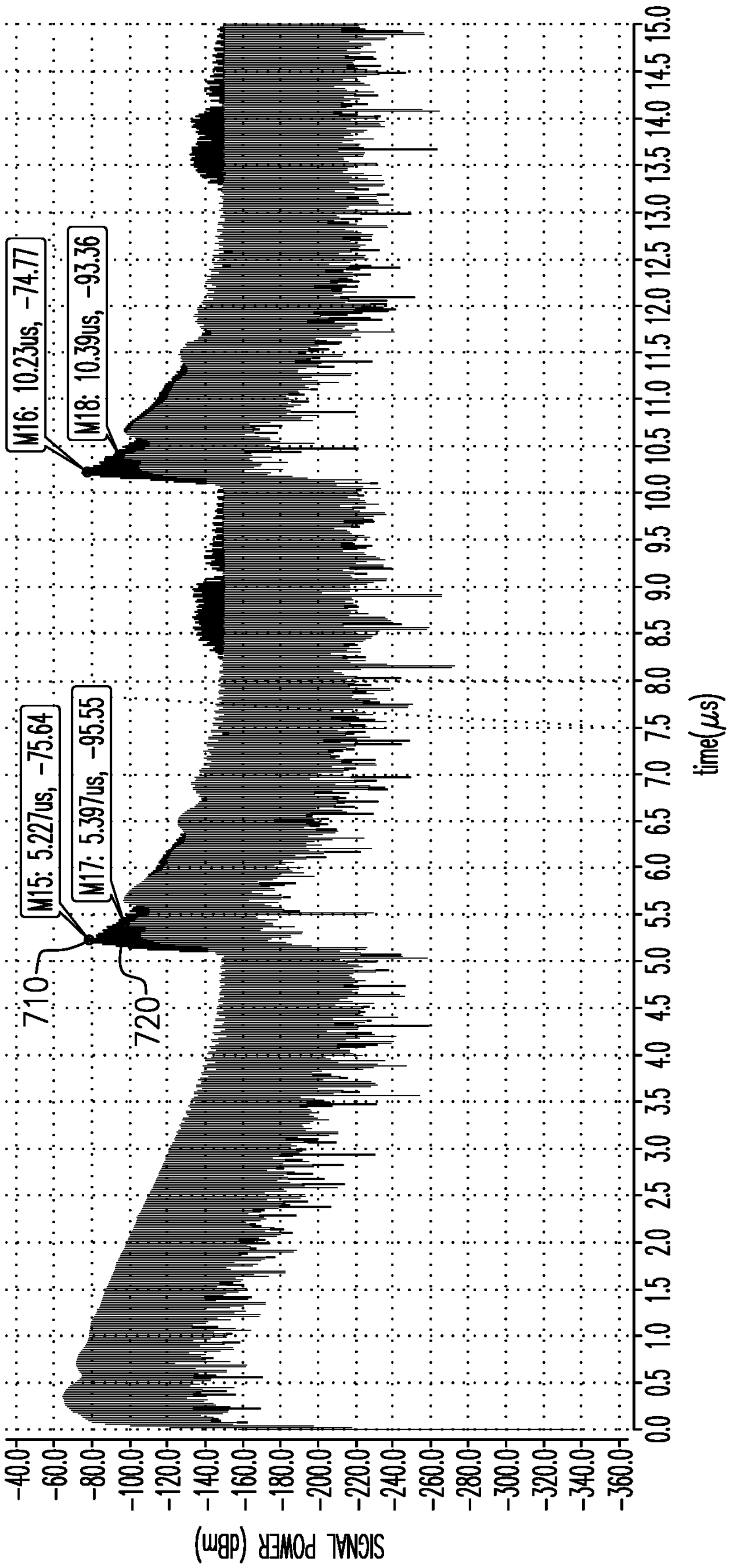
FIG. 7 is a further simulation of the spurious signal that is received at the RX port during switching for different switching speeds.

FIG. 7 is a further simulation of the spurious signal that is received at the RX port with trace 710 representing the signal power for a switching speed of 0.5 μs in one voltage step and trace 720 representing the signal power for a switching speed of 0.5 μs in two voltage steps. As can be seen from FIG. 7 by increasing the gate voltage in multiple steps, it is possible to provide a substantial reduction of the spurious levels while maintaining a fast switching speed. In particular, the simulation identifies that stepping the gate voltage in two steps provides a 20 dB reduction in the spurious signal during switching in comparison to the use of a standard uncontrolled gate voltage transition for the same switching speed.

Figure 8:
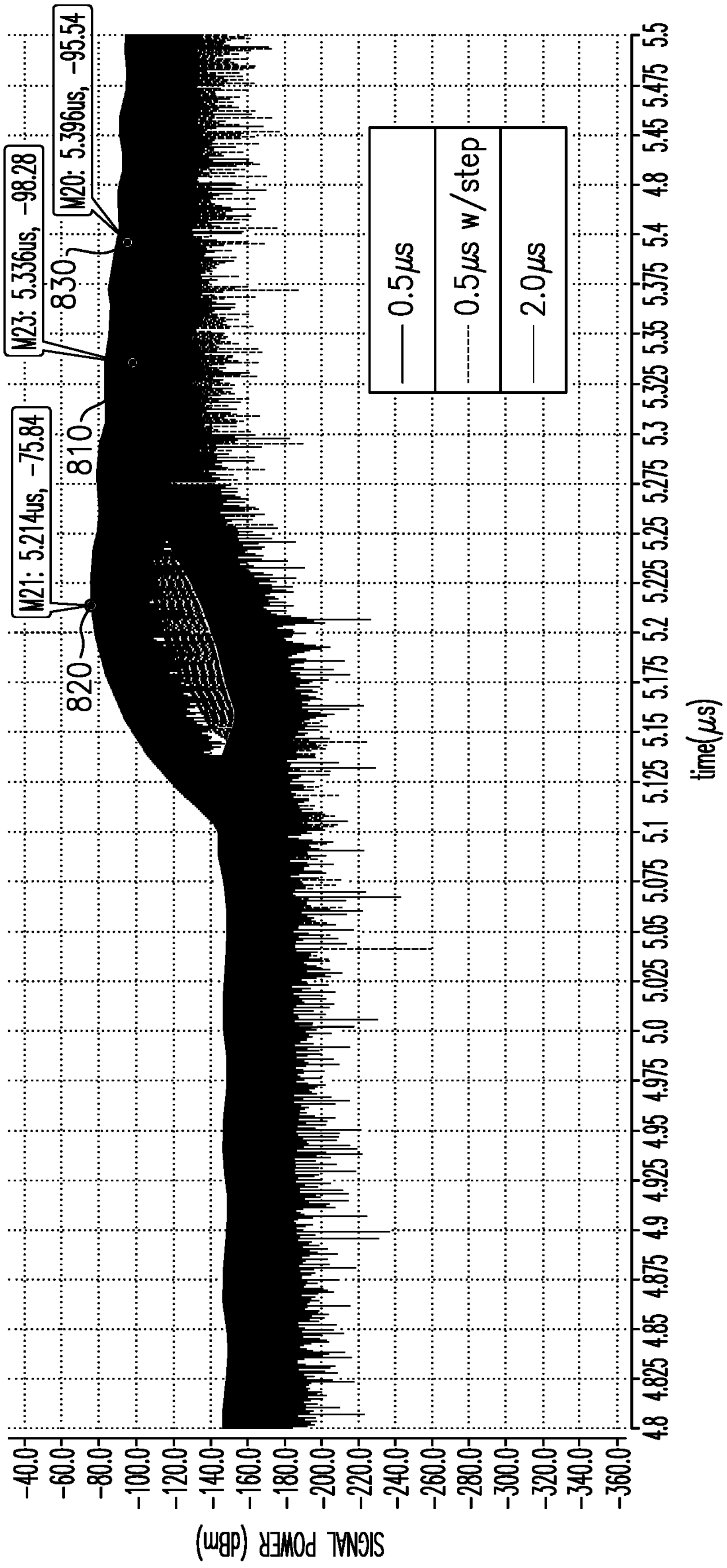
FIG. 8 is a another simulation of the spurious signal that is received at the RX port during switching for different switching speeds.

FIG. 8 combines the two above simulations of the spurious signal that is received at the RX port with trace 810 representing the signal power for a switching speed of 2.0 μs in one voltage step, trace 820 representing the signal power for a switching speed of 0.5 μs in one voltage step, and trace 830 representing the signal power for a switching speed of 0.5 μs in two voltage steps. The points M21 for trace 820, M23 for trace 810, and M20 for trace 830 represent the peak spurious signal level for each respective trace. As can be seen from this comparison, the 830 configuration using a switching speed of 0.5 μs in two voltage steps provides the same fast switching speeds of the 820 configuration using a switching speed of 0.5 μs in one voltage step, while providing comparable peak spurious signal levels to the 810 configuration using the much slower switching speed of 2.0 μs in one voltage step. Accordingly, configurations controlling the gate voltage in multiple steps over the switching transition can be used to reduce the peak level of spurious signals on the both the rising and falling edges of the switching transition such that fast switching speeds can be provided while maintaining acceptable levels of spurious emissions.

Figure 9:
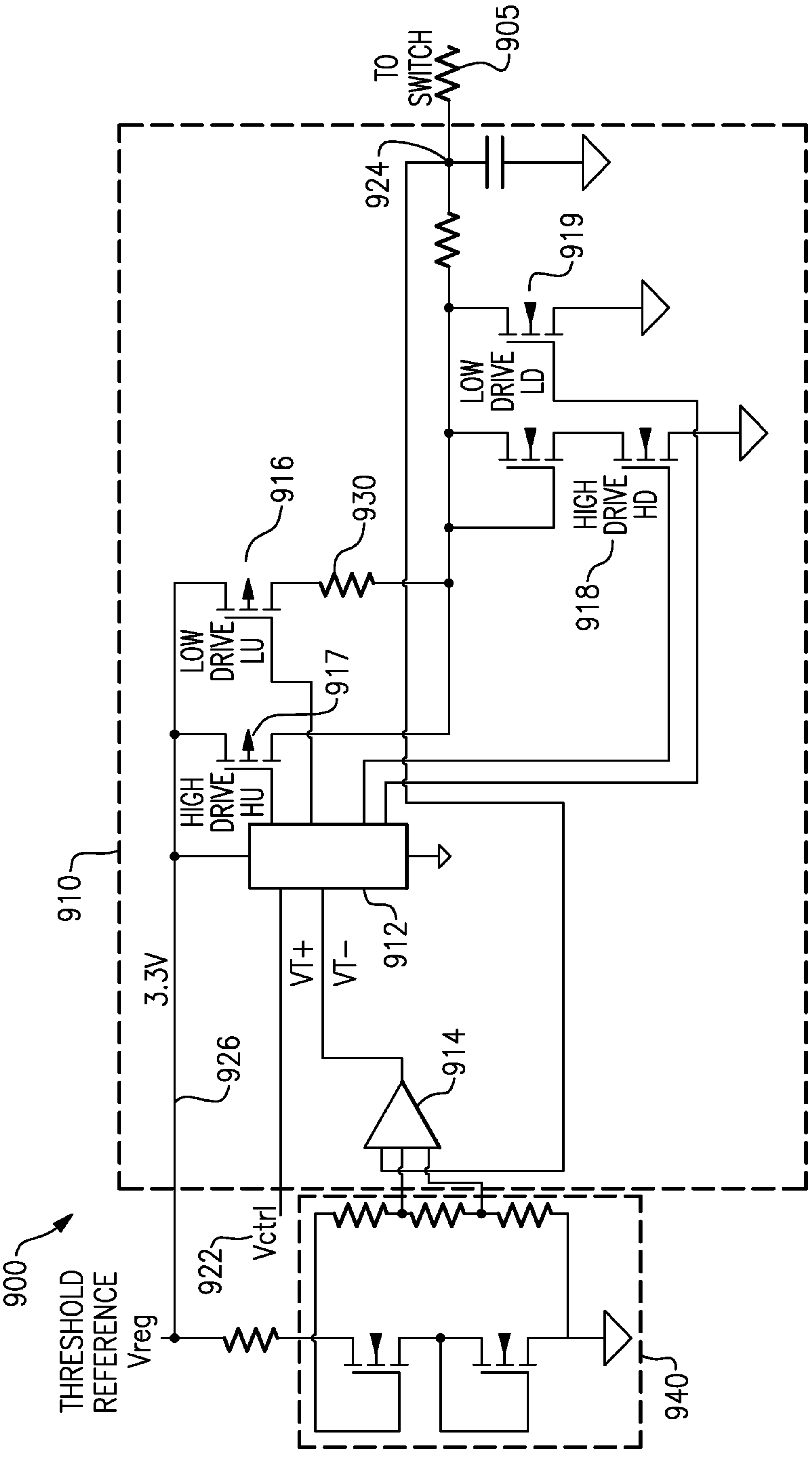
FIG. 9 is a schematic circuit diagram of one example for implementing an embodiment having some features of the present disclosure.

FIG. 9 is a schematic circuit diagram of one example circuit 900 for implementing an embodiment having some features of the present disclosure. The circuit 900 includes a gate voltage control circuit 910 that may be connected to the gate of the RF FET switch via a gate resistor 905. The gate voltage control circuit 910 includes a switch controller 912, a comparator 914, and a plurality of FET switches 916, 917, 918, and 919. The switch controller 912 is configured to receive a voltage control signal 922 that indicates when the state of the RF FET switch is to be transitioned between the ON and OFF states. The switch controller 912 is also configured to receive a control input from the comparator 914. The comparator 914 monitors the voltage output by the gate voltage control circuit 910 at point 924, and compares this to a reference voltage. By setting the reference voltage to be the desired target voltage for the first step in the stepped voltage transition, the comparator 914 can communicate to the switch controller 912 the point at which the target voltage can be increased for the second step in the stepped voltage transition.

In order to control the voltage output by the gate voltage control circuit 910, the switch controller 912 is coupled to the gates of the plurality of FET switches 916, 917, 918, and 919 that control the flow of voltage in the example circuit diagram of circuit 900. In a first step of the switching process, the switch controller 912 may receive a voltage control signal 922 indicating that the rising edge of the switching should begin, for example the voltage control signal 922 may be held high. In this step, the switch controller 912 may configure FET switches 917, 918, and 919 to be OFF while FET switch 916 is turned ON. In this manner, the voltage input to the gate voltage control circuit 910 on line 926 may be coupled to the point 924 via resistor 930. Resistor 930 may be configured to step the full voltage input down to the desired target voltage of the first step. FET switch 916 may be referred to as the low drive up switch LU, since this provides the lower voltage of the first step in the rising edge transition of the RF switch. The comparator 914 monitors the rising voltage at point 924, and when this is determined to have reached the target voltage, the output of the comparator 914 will change and this will be communicated to the switch controller 912. The switch controller may then apply a voltage to the gate of the FET switch 917 in order to turn this FET ON. FET 917 couples the voltage input from line 926 to the point 924, and accordingly the full ON voltage will then be supplied by the gate voltage control circuit 910. FET switch 917 may be referred to as the high drive up switch HU, since this provides the higher voltage of the second step in the rising edge transition of the RF switch.

Subsequently, the switch controller 912 may receive a voltage control signal 922 indicating that the falling edge of the switching should begin, for example the voltage control signal 922 may be held low. At this point, the comparator will still determine that the voltage at point 924 is equal to/more than the target voltage. Based on these two control signals, the switch controller 912 may apply a voltage to the gate of the FET switch 918 in order to turn this FET ON. FET 918 shunts a portion of the applied voltage to ground, and accordingly this reduces the voltage that is supplied by the gate voltage control circuit 910. FET switch 918 may be referred to as the high drive down switch HD, since this provides the higher voltage of the first step in the falling edge transition of the RF switch. The comparator 914 monitors the falling voltage at point 924, and when this is determined to have dropped below the target voltage, the output of the comparator 914 will change and this will be communicated to the switch controller 912. The switch controller may then apply a voltage to the gate of the FET switch 919 in order to turn this FET ON. FET 919 also shunts the applied voltage to ground and further lowers the voltage that is supplied by the gate voltage control circuit 910 such that a full OFF voltage will then be supplied by the gate voltage control circuit 910 to the RF switch. FET switch 919 may be referred to as the low drive down switch LD, since this provides the lower voltage of the second step in the falling edge transition of the RF switch.

In one embodiment, the reference voltage supplied to the comparator may be coupled via a temperature compensation circuit 940 as shown in FIG. 9. The temperature compensation circuit 940 may include one or more FET switches. Since the FET switches of the temperature compensation circuit 940 experience the same environmental conditions as the switches of the gate voltage control circuit and the RF switch, this may be used to calibrate the reference voltage and improve the temperature stability of the gate voltage control circuit 910.

While the above example transitioned the voltage for the rising and falling edges in two steps, it will be appreciated that a higher number of steps may be used in further examples. However, it has been observed that the majority of the change in the impedance in the RF switch occurs while the gate voltage of the RF switch is crossing the voltage threshold of the RF switch. Outside of this region, the slew rate may be increased without a significant increase in the spurious emissions.

In one example, the target voltage for the intermediate step in the rising and falling edges of the switching transition may both be the same. Alternatively, the target voltage for the first step during the rising edge of the switching transition may be set to be slightly higher than the threshold voltage of the RF switch, and the target voltage for the first step during the falling edge of the switching transition may be set to be slightly lower than the threshold voltage of the RF switch.

In some implementations, an RF switch including the gate voltage control circuit 910 may be incorporated into an RF coupler switching module for providing impedance matching in 5G NR applications. In further implementations, the RF switch including the gate voltage control circuit 910 may be incorporated into a coupler combiner switch for connecting multiple TX paths to a single feedline and antenna. Standard coupler combiner switches also suffer from the same receiver sensitivity degradation in 5G NR applications. In addition to providing fast switching that meets the 5G NR switching requirements for feedback receivers, this also enables integration of the coupler combiner switch into a single module, thus improving the overall system performance for 5G NR.

Figure 10:
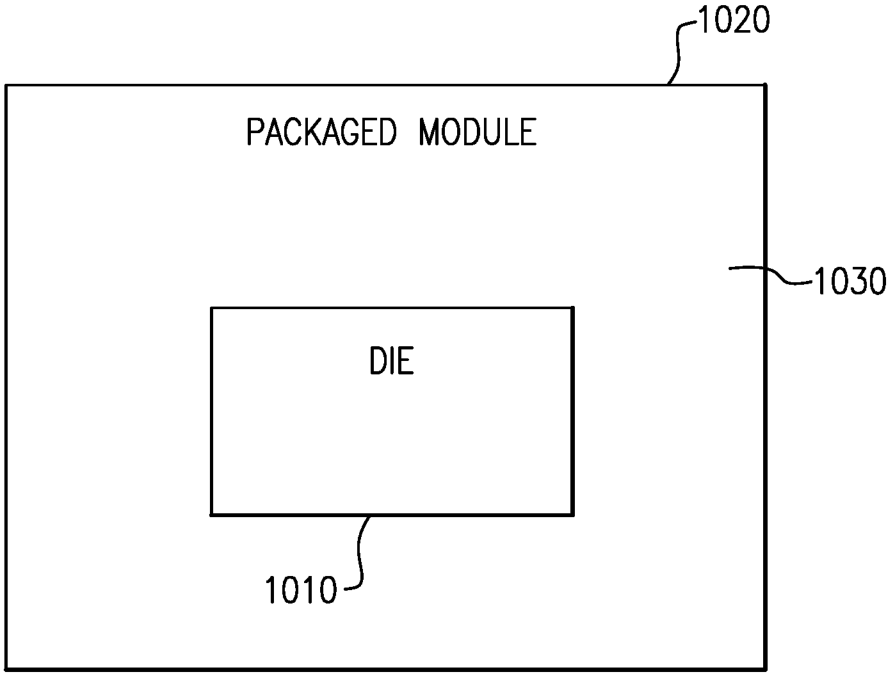
FIG. 10 is a die implemented in a packaged module having one or more features according to aspects of the present disclosure.

FIG. 10 is a die 1010 implemented in a packaged module 1020. Such a packaged module can include a packaging substrate 1030 configured to receive a plurality of components. In one example, the packaging substrate may be configured to receive one or more RF switches having one or more features described herein. In one example the packaged module 1020 may be a front end module. In some examples, the packaging substrate 1030 may be configured to receive further components such as an RF power amplifier (PA), one or more RF filters, and/or a low noise amplifier (LNA). The packaged module may be implemented in a single-sided or double-sided molded package.

Embodiments of the RF switch disclosed herein, optionally packaged into a module, may be advantageously used in a variety of electronic devices. General examples of an electronic device may include a circuit board having numerous modules mounted thereon. The circuit board may have multiple layers and may include circuit elements and interconnections in the layers and/or mounted on the surface of the circuit board. Each of the modules may have a multilayer substrate within and upon which there may also be various circuit elements and interconnections. Additionally, the modules may further include dies, each of which may have multiple layers and include various circuit elements and interconnections. An RF switch in accord with aspects and embodiments disclosed herein may be implemented within, among, or across any of the layers of the various structures, e.g. circuit board, substrates, and dies, as part of an electronic device, such as a smart-phone, wireless tablet, laptop computer, smart device, hand-held wireless device with or without phone functionality, router, cable modem, wireless access point, etc.

Figure 11:
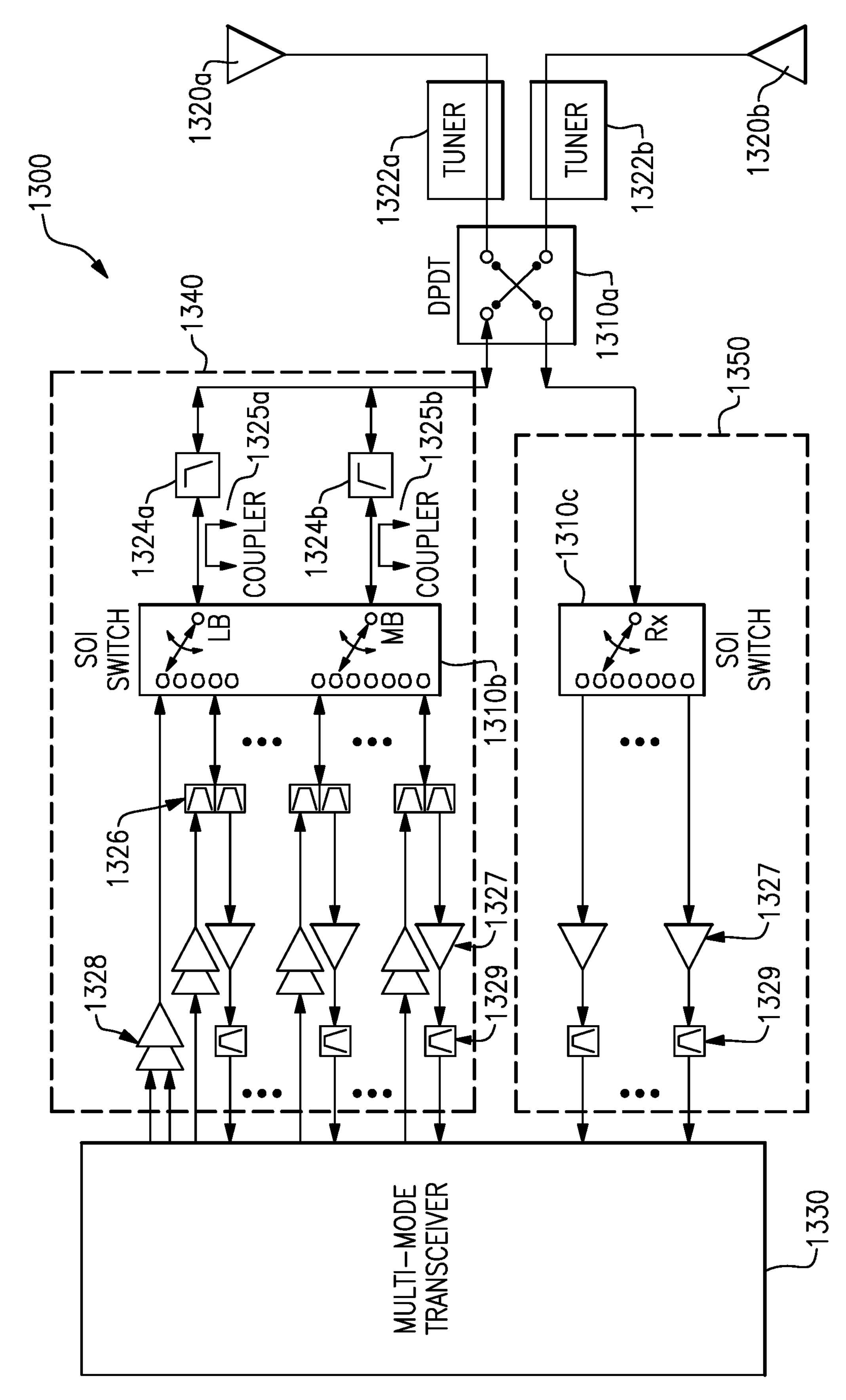
FIG. 11 depicts an example wireless device having one or more features according to aspects of the present disclosure.

FIG. 11 depicts an example wireless device 1300 having one or more advantageous features described herein. In the example of FIG. 11, wireless device 1300 includes RF switches 1310*a*, 1310*b*, and 1310*c*, wherein one or more of the RF switches 1310*a*, 1310*b*, and 1310*c* may be configured to include gate voltage control circuitry having one or more embodiments of the above disclosure. The wireless device 1300 further includes two couplers 1325*a* and 1325*b* that are positioned on the antenna path between the RF switch 1310*b*, which may act as an antenna switch module (ASM), and the antennae 1320*a* and 1320*b*. These couplers 1325*a* and 1325*b* may alternatively, or additionally, be configured to include switches with gate voltage control circuitry having one or more embodiments of the above disclosure. For example, the couplers 1325*a* according to certain embodiments can be similar to or the same as the coupler 220 of FIG. 2.

Those skilled in the art will appreciate that a wireless device may include fewer, more and/or different components than are illustrated in FIG. 11, and that FIG. 11 merely includes some example components. The portion of the device 1300 illustrated in FIG. 11 includes a multi-mode transceiver 1330, a front-end module (FEM) 1340, and a diversity receive FEM 1350. In a wireless system, a front-end module (FEM) acts as an interface between the antenna and RF transceiver. The switch 1310*a* may be referred to as an antenna swap switch, switch 1310*b* may be referred to as a FEM switch, and switch 1310*c* may be referred to as a diversity FEM switch. The device 1300 also includes tuners 1322*a* and 1322*b*, diplexers 1324*a* and 1324*b*, duplexers 1326, amplifiers 1327 and 1328, and filters 1329.

The multi-mode transceiver 1330 is coupled to the FEM 1340 and the diversity FEM 1350. For the sake of simplifying the description herein, the multi-mode transceiver 1330 includes what those skilled in the art would consider the radio back-end or baseband and intermediate frequency (IF) components. Baseband and IF components typically implement functions such as, but not limited to, voice-to-data encoding, packet forming and framing of data, forward error correction, pulse shaping, etc. Those skilled in the art will appreciate from the present description that various baseband and IF functions are often implemented in various wireless devices, and that a more detailed description of those functions has been omitted for the sake of brevity.

The antenna swap switch 1310*a* selectively couples the antennas 1320*a*, 1320*b* to the FEM 1340 and/or the diversity FEM 1350. The antenna swap switch 1310*a* is a dual pole dual throw (DPDT) switch.

The FEM 1340 and diversity FEM 1350 are multi-band FEMs. To that end, for example and without limitation, the FEM 1340 and/or diversity FEM 1350 can include modules for EDGE/EGPRS (Enhanced Data Rate GSM Evolution/Enhanced General Packet Radio Service), CDMA (e.g., 1×RTT, Evolution-Data Optimized CDMA (EV-DO)), UMTS-TDD (Universal Mobile Telecommunications System-Time Division Duplex), LTE-Advanced, and the like. The corresponding amplifiers 1327 provide respective receiver side amplifiers (e.g., low-noise amplifiers or LNAs). The corresponding amplifiers 1328 provide respective transmitter side amplifiers (e.g., power amplifiers or PAs).

The device 1300 is designed for operation on multiple frequency bands. This can be used in carrier aggregation (CA) configurations and MIMO configurations, for example and without limitation. The device 1300 includes diplexers 1324*a*, 1324*b* respectively configured to direct low-band (LB) signals and mid-band (MB) signals to the FEM switch 1310*b*. Transmit signals can be routed from the multi-mode transceiver 1330 through amplifiers 1328 to duplexers 1326 and through switches 1310*b* and 1310*a* to a particular antenna 1320*a*, 1320*b*. Similarly, receive signals can be routed from a particular antenna 1320*a*, 1320*b* through switches 1310*a*, 1310*b* and duplexers 1326 to amplifiers 1327 and filters 1329 to the multi-mode transceiver 1330.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed:

1. A radio frequency coupler comprising:

a plurality of switches, each switch of the plurality of switches including at least one field-effect transistor and a gate voltage control circuit having a voltage input and a voltage output, the voltage output being coupled to a gate of the switch, the gate voltage control circuit being configured to transition a state of the switch between an ON state and an OFF state by changing a voltage supplied to a gate of the at least one field-effect transistor in multiple steps, a direction of power measurement of the radio frequency coupler determined by switching states of the plurality of switches.

2. The radio frequency coupler of claim 1 wherein the gate voltage control circuit is configured to transition the state of the at least one field-effect transistor between an ON state and an OFF state by changing the voltage supplied to the gate of the at least one field-effect transistor in two steps.

3. The radio frequency coupler of claim 2 wherein the gate voltage control circuit is configured to supply a first voltage in a first step, and a second voltage in a second step, the first voltage approximating a threshold voltage of the at least one field-effect transistor and the second voltage being configured to hold the at least one field-effect transistor in a fully ON or fully OFF state.

4. The radio frequency coupler of claim 3 wherein the gate voltage control circuit further includes a switch controller configured to control an output voltage of the voltage output.

5. The radio frequency coupler of claim 4 wherein the gate voltage control circuit further includes a comparator configured to compare the output voltage of the voltage output with a reference voltage, the gate voltage control circuit configured to determine whether to supply the first voltage or the second voltage during switching depending on whether the output voltage of the voltage output is determined to be above or below the reference voltage.

6. The radio frequency coupler of claim 4 wherein the gate voltage control circuit further includes a first pair of field-effect transistors and a second pair of field-effect transistors, the first pair of field-effect transistors being coupled to the voltage input to control a rising edge of the output voltage and the second pair of field-effect transistors being coupled to respective shunts to ground to control a falling edge of the output voltage.

7. The radio frequency coupler of claim 5 further comprising a temperature compensation circuit, the temperature compensation circuit including one or more field-effect transistors, the reference voltage being configured to be supplied to the comparator via the one or more field-effect transistors.

8. The radio frequency coupler of claim 1 wherein the radio frequency coupler forms part of a coupler combiner switch.

9. A radio frequency module comprising:

a packaging substrate configured to receive a plurality of components; and at least one radio frequency switch including at least one field-effect transistor; and a gate voltage control circuit having a voltage input and a voltage output, the voltage output being coupled to a gate of the at least one radio frequency switch, the gate voltage control circuit being configured to transition a state of the at least one radio frequency switch between an ON state and an OFF state by changing a voltage supplied to a gate of the at least one field-effect transistor in multiple steps.

10. The radio frequency module of claim 9 wherein the gate voltage control circuit is configured to transition a state of the at least one field-effect transistor between an ON state and an OFF state by changing a voltage supplied to the gate of the at least one field-effect transistor in two steps.

11. The radio frequency module of claim 10 wherein the gate voltage control circuit is configured to supply a first voltage in a first step, and a second voltage in a second step, the first voltage approximating a threshold voltage of the at least one field-effect transistor and the second voltage being configured to hold the at least one field-effect transistor in a fully ON or fully OFF state.

12. The radio frequency module of claim 11 wherein the gate voltage control circuit further includes a switch controller configured to control an output voltage of the voltage output.

13. The radio frequency module of claim 12 wherein the gate voltage control circuit further includes a comparator configured to compare the output voltage of the voltage output with a reference voltage, the gate voltage control circuit configured to determine whether to supply the first voltage or the second voltage during switching depending on whether the output voltage of the voltage output is determined to be above or below the reference voltage.

14. The radio frequency module of claim 13 further comprising a temperature compensation circuit, the temperature compensation circuit including one or more field-effect transistors, the reference voltage being configured to be supplied to the comparator via the one or more field-effect transistors.

15. The radio frequency module of claim 9 wherein the at least one radio frequency switch forms part of a radio frequency coupler.

16. The radio frequency module of claim 9 wherein the at least one radio frequency switch forms part of an antenna switch module.

17. A wireless device comprising:

a transceiver configured to generate a radio frequency signal;

a front-end module in communication with the transceiver and configured to amplify the radio frequency signal to generate an amplified radio frequency signal, the front-end module including at least one radio frequency switch including at least one field-effect transistor, and a gate voltage control circuit having a voltage input and a voltage output, the voltage output being coupled to a gate of the at least one radio frequency switch, the gate voltage control circuit being configured to transition as state of the at least one radio frequency switch between an ON state and an OFF state by changing a voltage supplied to a gate of the at least one field-effect transistor in multiple steps; and an antenna in communication with the front-end module, the antenna configured to transmit the amplified radio frequency signal.

18. The wireless device of claim 17 wherein the at least one radio frequency switch forms part of an antenna swap switch coupled between the front-end module and the antenna.

19. The wireless device of claim 17 wherein the at least one radio frequency switch forms part of a radio frequency coupler.

20. The wireless device of claim 17 wherein the at least one radio frequency switch forms part of an antenna switch module.

* * * * *